United States Patent [19]

de Frésart et al.

[11] Patent Number: 5,272,096
[45] Date of Patent: Dec. 21, 1993

[54] METHOD FOR MAKING A BIPOLAR TRANSISTOR HAVING A SILICON CARBIDE LAYER

[75] Inventors: Edouard D. de Frésart, Tempe; Hang M. Liaw, Scottsdale, both of Ariz.

[73] Assignee: Motorola, Inc., Schaumburg, Ill.

[21] Appl. No.: 953,177

[22] Filed: Sep. 29, 1992

[51] Int. Cl.⁵ ......................................... H01L 21/265
[52] U.S. Cl. ........................................ 437/31; 437/32; 437/100; 437/105; 148/DIG. 11; 148/DIG. 148
[58] Field of Search ............... 437/100, 31, 32, 105; 148/DIG. 10, DIG. 11, DIG. 148

[56] References Cited

U.S. PATENT DOCUMENTS

| | | | |
|---|---|---|---|
| 4,945,394 | 7/1990 | Palmour et al. | 437/100 |
| 5,021,103 | 6/1991 | Hamakawa et al. | 148/DIG. 148 |
| 5,162,255 | 11/1992 | Ito et al. | 148/DIG. 148 |

FOREIGN PATENT DOCUMENTS 399241  4/1990  European Pat. Off. ............ 437/100

OTHER PUBLICATIONS

Unagami "Formation mechanism of porous silicon layer by anodisation in HF solution" in Jr. Electrochem. Soc. 127(2), 1980, pp. 476–483.

T. Sugii et al, "Si Hetero-Bipolar Transistor with an SiC Emitter and a Thin Epitaxial Base", International Electron Devices Meeting, pp. 89–659 to 89–662, 1989.

Shigehiro Nishino et al, "Epitaxial Growth and Electrical Characteristics of Cubic SiC on Silicon", Journal of Applied Physics, vol. 61, No. 10, pp. 4889–4893, May 1987.

T. Sugii et al, "β-SiC/Si Heterojunction Bipolar Transistors with High Current Gain", IEEE Electron Device Letters, vol. 9, No. 2, pp. 87–89, Feb. 1988.

Y. Furumura et al, "Heteroepitaxial β-SiC on Si", Journal of the Electrochemical Society, vol. 135, No. 5, pp. 1255–1260, May 1988.

Denny D. Tang et al, "A Reduced-Field Design Concept for High-Performance Bipolar Transistors", IEEE Electron Device Letters, vol. 10, No. 2, pp. 67–69, Feb. 1989.

B. C. Johnson et al, "Characterization and Growth of SiC Epilayers on Si Substrates", Superlattices and Microstructures, vol. 2, No. 3, pp. 223–231, 1986.

*Primary Examiner*—Olik Chaudhuri
*Assistant Examiner*—Ramamohan Rao Paladugu
*Attorney, Agent, or Firm*—Robert F. Hightower

[57] ABSTRACT

A layer of silicon carbide (33, 38, 41) is utilized in forming a bipolar transistor (30, 40). The transistor (30, 40) is formed on a substrate (31, 32) that has a single crystal silicon surface. The layer of silicon carbide (33, 38, 41) is epitaxially formed on the single crystal silicon surface. Thereafter, a layer of silicon (34) is epitaxially formed on the layer of silicon carbide (33, 38, 41). The silicon carbide (33, 38, 41) functions as an active transistor layer or alternately is within the transistor's depletion region.

27 Claims, 2 Drawing Sheets

METHOD FOR MAKING A BIPOLAR TRANSISTOR HAVING A SILICON CARBIDE LAYER

BACKGROUND OF THE INVENTION

The present invention relates, in general, to semiconductor devices, and more particularly, to semiconductor devices that utilize silicon carbide.

Previously, the semiconductor industry has employed silicon carbide in the formation of semiconductor diodes and transistors. Due to the greater than 20% lattice structure mismatch between silicon carbide and silicon, prior efforts of growing epitaxial silicon carbide on single crystal silicon generally result in high defect densities, generally greater than $10^6/cm^2$, near the silicon to silicon carbide interface. Such high defect densities restrict the efficiency of semiconductor devices that use such layers. In some cases, a layer of carbon is formed between the silicon and the silicon carbide, often referred to as carbonization, to reduce the defect densities. Such carbonization generally requires temperatures in excess of about 1250 degrees Celsius (° C). Such temperatures can damage the P-N junctions of semiconductor devices.

A further problem is the difficulty in forming thick, greater than approximately 100 nanometers, low defect density, less than $10^6/cm^2$, single crystal silicon on silicon carbide. Therefore, the usefulness of silicon carbide is limited to device structures that do not require single crystal silicon on silicon carbide.

Accordingly, it is desirable to have a method of forming low defect density epitaxial silicon on single crystal silicon carbide, a method of epitaxially applying silicon carbide to single crystal silicon; and to have a transistor structure that utilizes epitaxial silicon carbide on single crystal silicon, and that utilizes epitaxial silicon on single crystal silicon carbide.

SUMMARY OF THE INVENTION

Briefly stated, the present invention includes forming a layer of silicon carbide on a layer of silicon. The silicon has a single crystal silicon surface. The silicon carbide is epitaxially formed on the single crystal silicon surface. Thereafter, a layer of silicon is epitaxially formed on a surface of the silicon carbide.

DETAILED DESCRIPTION OF THE DRAWINGS

It has been found that epitaxial silicon carbide can be grown on conventional (100) silicon, as well as other orientations, by converting a substantially planar single crystal silicon surface to a porous buffer layer of single crystal silicon prior to depositing the silicon carbide. It is believed that along the substantially planar single crystal silicon surface, silicon atoms rigidly occupy their sites within the silicon lattice structure. Unattached bonds of these surface atoms form dangling bonds that radiate at fixed angles from the surface. These dangling bonds prevent matching silicon carbide's lattice structure to silicon's lattice structure thereby preventing the growth of thick (greater than approximately 100 nanometers) low defect epitaxial silicon carbide. The porous buffer layer is composed of a plurality of randomly distributed atomic level pores along the single crystal silicon surface. Within the irregular pores, dangling silicon bonds are randomly distributed. Consequently, the dangling bonds are able to bend and conform to the lattice dimensions of the epitaxial silicon carbide. Silicon bonds that do not terminate to silicon carbide are able to bend and terminate to other dangling silicon bonds along the porous buffer layer. Thus, misfit dislocations along the silicon/silicon carbide interface are substantially eliminated thereby reducing the defect density below approximately $10^6/cm^2$.

The average depth of the porous buffer layer determines the silicon carbide thickness that can be formed before misfit dislocations are generated. Generally, the buffer layer should have a depth of approximately one-fifth to one-tenth the thickness of the silicon carbide layer that is to be formed. It has been found that silicon carbide thicknesses between 500 and 5,000 nanometers can be epitaxially formed on a porous buffer layer approximately 100 nanometers thick.

Additionally, it is believed that doping the silicon carbide with germanium can further reduce stress between the silicon and silicon carbide thereby further reducing the number of misfit dislocations and improving the system's mechanical stability.

Figure 1:
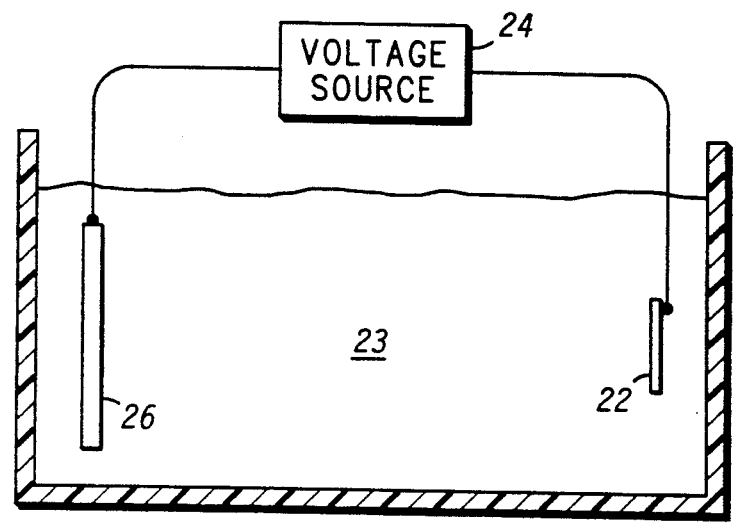
FIG. 1 illustrates an apparatus used in forming a porous silicon layer in accordance with the present invention.

FIG. 1 illustrates an apparatus 21 for forming a porous buffer layer on a wafer 22 that has a single crystal silicon surface. Wafer 22 is placed in a solution 23 that etches silicon. Solution 23 can have a variety of compositions as long as such compositions slowly etch silicon. Suitable solutions include a solution of ethanol and aqueous hydrogen fluoride (HF), and water with HF. In the preferred embodiment, solution 23 includes an aqueous hydrogen fluoride and water solution with an HF concentration between approximately ten and fifty percent. A potential from a voltage source 24 is applied between wafer 22 and an electrode 26 in order to create current flow between wafer 22 and solution 23. Wafer 22 generally is highly doped to lower the resistance thereby increasing current flow and improving the generation of pores. In the preferred embodiment, electrode 26 is platinum, and a current density of approximately twenty to one hundred milliamps/$cm^2$ flows for approximately one-half of a minute to ten minutes in order to create the porous buffer layer. Current flow is not required, although the immersion time is increased to approximately twenty-four to thirty-six hours without the current flow. The resulting buffer layer can be used for epitaxially applying single crystal silicon carbide to single crystal silicon having any lattice orientation, e.g. (100), (111), etc.

In order to improve the characteristics of semiconductor devices, it is also desirable to create single crystal silicon on single crystal silicon carbide. Forming such epitaxial silicon on silicon carbide has previously been limited by the lattice mismatch of silicon and silicon carbide. It is believed that the surface of single crystal silicon carbide is terminated in carbon atoms which prevent the nucleation of single crystal silicon onto single crystal silicon carbide. It has been found that creating a very rough surface on silicon carbide permits the growth of epitaxial silicon. It is believed that the rough surface creates microatomic multifaceted planes having dangling silicon bonds which permit silicon nucleation on the silicon carbide. The rough surface includes a plurality of randomly distributed atomic level depressions in the silicon carbide surface. The depth of the depressions depends on the thickness of the epitaxial silicon layer to be formed. Generally, the depth of the depressions are about one-fifth to one-tenth the thickness of the silicon layer. Although, depression depths greater than ten to twenty nanometers may leave a rough silicon carbide surface that can cause leakage when used as the active layer of a transistor. It is believed that a minimum depth of approximately five to ten nanometers is required to form sufficient micro-atomic multifaceted planes along the depression's sidewalls to facilitate single crystal silicon nucleation. However, if the silicon layer to be formed is less than approximately five nanometers, it may not be necessary to form the rough surface. In the preferred embodiment, depressions between approximately six and twelve nanometers are used to form an epitaxial silicon layer approximately thirty nanometers thick. The rough surface can be created by a variety of methods including mechanical roughing that uses ultra-fine silicon carbide or diamond abrasive particles. Also, ion or particle bombardment using nitrogen fluoride can be used when it is desirable to limit the rough surface to several atomic layers. This method substantially eliminates defects.

Figure 2:
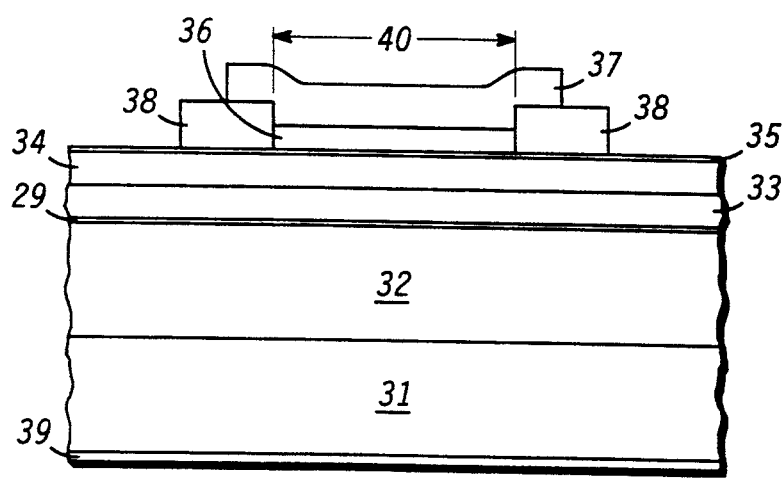
FIG. 2 illustrates a cross-section of a portion of a transistor in accordance with the present invention.

FIG. 2 illustrates an enlarged portion of an embodiment of a transistor 30 which includes single crystal silicon that is epitaxially formed on single crystal silicon carbide. Transistor 30 includes a silicon substrate 31 with a doped silicon epitaxial layer 32 formed on a top or first surface of substrate 31 in order to function as a low resistance collector region of transistor 30. In the preferred embodiment, substrate 31 has a (100) orientation. Also in this preferred embodiment, layer 32 has a thickness of approximately 0.4 to 3.0 microns, and is heavily doped N-type with an arsenic doping concentration of approximately $5 \times 10^{15}$ to $5 \times 10^{17}$ atoms/cm$^3$. A surface of epitaxial layer 32 is treated as explained hereinbefore in order to transform a portion of the single crystal silicon surface of layer 32 into a porous buffer layer 29. In the preferred embodiment, the depth of layer 29 is approximately twenty to one hundred nanometers. A first silicon carbide layer 33 is epitaxially formed on layer 29 by a method such as chemical vapor deposition (CVD), plasma enhanced chemical vapor deposition (PECVD), gas phase molecular beam epitaxy (MBE), or other similar means. In the preferred embodiment, layer 33 is intrinsic silicon carbide and has a thickness of approximately 0.1 to 0.5 microns. After layer 33 is formed, the surface of layer 33 is roughened in order to form a plurality of micro-atomic multifaceted planes as explained hereinbefore. Subsequently, an in-situ doped silicon layer 34 is epitaxially formed on the roughened surface of layer 33 to function as a base of transistor 30. The thickness of layer 34 depends on the doping level, but generally is as thin as possible in order to provide low base transit time and improve the performance of transistor 30. In the preferred embodiment, layer 34 has a thickness of approximately 60 to 100 nanometers, and is doped P-type with a boron doping concentration of approximately $5 \times 10^{18}$ atoms/cm$^3$. A porous surface 35 is formed on layer 34, as explained hereinbefore, in order to epitaxially form a single crystal silicon carbide layer 36 on layer 34. In the preferred embodiment, layer 36 is intrinsic silicon carbide and has a thickness of approximately five nanometers. Layer 36 is patterned to have a width that will subsequently define an emitter-base junction width 40 of transistor 30. A pair of dielectric spacers 38 abut layer 36 in order to electrically isolate the emitter-base junction of transistor 30. A polysilicon emitter 37 is formed on layer 36 and overlaps onto spacers 38. Since polysilicon has a random grain structure instead of a repetitive lattice structure, it is not necessary to roughen the surface of layer 36 in order to form polysilicon emitter 37. In the preferred embodiment, emitter 37 has an arsenic doping concentration of $1 \times 10^{21}$ atoms/cm$^3$, and a thickness of approximately 200 nanometers. Transistor 30 also has a collector contact 39 on a bottom or second surface of substrate 31.

Layers 32 and 34 form a collector-base P-N junction while layer 34 and emitter 37 form an emitter-base P-N junction. When a voltage is applied to transistor 30, each P-N junction includes a depletion region. The thickness of layers 33 and 36 is formed to be approximately equal to the width of the respective depletion region associated with the layers surrounding layers 33 and 36. Placing silicon carbide layers 33 and 36 within the collector-base and emitter-base junctions respectively, increases electron velocity within each depletion region thereby improving the performance of transistor 30. The collector-base and emitter-base breakdown voltages of transistor 30 are greater than respective breakdown voltages of comparable silicon transistors. Also, the cut-off frequency ($f_t$) of transistor 30 is greater than that of comparable silicon transistors.

Figure 3:
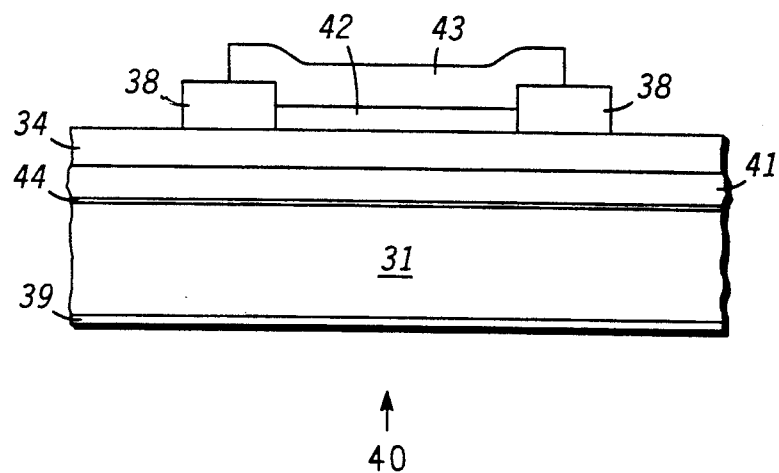
FIG. 3 illustrates a cross-sectional portion of an alternate transistor embodiment in accordance with the present invention.

FIG. 3 illustrates an enlarged cross-sectional portion of an alternate embodiment of a transistor 40 that employs a single crystal silicon carbide layer as a collector. Portions of FIG. 3 that are the same as FIG. 2 have the same reference numerals. Transistor 40 includes substrate 31 and collector contact 39 as described in FIG. 2. As described hereinbefore, a portion of the first surface of substrate 31 is transformed into a porous buffer layer 44. Thereafter, a doped silicon carbide layer 41 is formed on layer 44 by the methods discussed hereinbefore. Layer 41 serves as a collector region that facilitates high electron velocity thereby improving the performance, and the breakdown voltage of transistor 40 relative to comparable silicon transistors. In the preferred embodiment, layer 41 has an N-type arsenic doping concentration of approximately $5 \times 10^{15}$ to $5 \times 10^{17}$ atoms/cm$^3$, and a thickness of approximately 400 to 3000 nanometers. Transistor 40 has a base provided by a doped silicon layer 34 that is epitaxially formed on layer 41 by the methods described hereinbefore. A doped silicon layer 42 is formed on layer 34, and thereafter patterned to serve as the emitter of transistor 40. In the preferred embodiment, layer 42 is doped polysilicon. Electrical contact to layer 42 is provided by an ohmic contact 43 on layer 42.

Forming the collector from silicon carbide increases the performance and the base-collector breakdown voltage of transistor 40 about 2.5 times that of comparable silicon transistors.

Although the method of forming epitaxial silicon carbide on silicon, and epitaxial silicon on silicon carbide has been explained using a particular transistor structure, it should be noted that the methods are also applicable to other transistor structures, such as a trench isolated transistor having a collector contact on the transistor's top surface.

By now it should be appreciated that there has been provided a novel method of forming a bipolar transistor. Utilizing silicon carbide to form the transistor increases the transistor's high frequency performance and breakdown voltage. Forming a porous silicon buffer layer prior to applying a layer of silicon carbide facilitates forming epitaxial silicon carbide on (100) single crystal silicon. The buffer layer substantially eliminates misfit dislocations, and the (100) orientation provides more efficient transistor operation. Creating a plurality of micro-atomic multifaceted planes in single crystal silicon carbide facilitates forming epitaxial silicon on single crystal silicon carbide. The micro-atomic multifaceted planes substantially eliminate misfit dislocations and improve the reliability of resulting transistors. Additionally, the P-N junctions of semiconductor devices are not adversely affected since high temperatures, in excess of approximately 1250° C., are not required. Positioning a silicon carbide layer within the emitter-base and within the collector-base junctions improves the transistor's breakdown voltage and performance. Utilizing a doped silicon carbide layer for the transistor's collector also improves the transistor's breakdown voltage and high frequency performance.

We claim:

1. A method of forming a bipolar transistor having a silicon carbide layer comprising:
    providing a silicon substrate having a first surface and a second surface;
    epitaxially forming a first silicon layer on the first surface of the substrate wherein the first silicon layer has a first conductivity type;
    epitaxially forming a first silicon carbide layer on the first silicon layer wherein the first silicon carbide layer has a surface;
    covering the first silicon carbide layer with a second silicon layer wherein the second silicon layer has a second conductivity type and is epitaxially formed on the surface of the first silicon carbide layer;
    epitaxially forming a second silicon carbide layer on the second silicon layer; and
    applying a third silicon layer on the second silicon carbide layer.

2. The method of claim 1 wherein epitaxially forming the first silicon carbide layer on the first silicon layer includes converting a portion of the first silicon layer to a porous buffer layer prior to epitaxially forming the first silicon carbide layer, the porous buffer layer having a depth.

3. The method of claim 2 wherein epitaxially forming the first silicon carbide layer includes epitaxially forming the first silicon carbide layer having a thickness that is less than approximately five to ten times the depth of the porous buffer layer.

4. The method of claim 2 wherein converting a portion of the first silicon layer to a porous buffer layer includes forming the porous buffer layer having a depth between approximately 20 and 100 nanometers.

5. The method of claim 2 wherein converting a portion of the first silicon layer to a porous buffer layer includes treating the first silicon layer with hydrofluoric acid while causing a current to flow between the first silicon layer and the hydrofluoric acid.

6. The method of claim 1 wherein covering the first silicon carbide layer with the second silicon layer includes in-situ doping the second silicon layer as P-type by using a boron dopant.

7. The method of claim 1 wherein covering the first silicon carbide layer with the second silicon layer includes creating a plurality of micro-atomic multifaceted planes on the surface of the first silicon carbide layer prior to applying the second silicon layer.

8. The method of claim 7 wherein creating the plurality of micro-atomic multifaceted planes on the surface of the first silicon carbide layer includes mechanically roughening the surface of the first silicon carbide layer to form depressions having a depth between approximately six and twelve nanometers wherein the micro-atomic multifaceted planes are formed along sidewalls of the depressions.

9. The method of claim 1 wherein applying the third silicon layer on the second silicon carbide layer includes applying a layer of polysilicon on the second silicon carbide layer.

10. The method of claim 1 wherein epitaxially forming the first silicon layer on the first surface of the substrate wherein the first silicon layer has the first conductivity type includes forming the first silicon layer as N-type.

11. The method of claim 1 further including applying a collector contact on the second surface of the substrate.

12. A method of forming a semiconductor device comprising:
    providing a silicon substrate having a first surface and a second surface wherein the first surface is single crystal silicon;
    epitaxially forming a layer of silicon carbide on the first surface; and
    epitaxially forming a layer of silicon on the layer of silicon carbide.

13. The method of claim 12 further including forming an ohmic contact on the second surface of the substrate.

14. The method of claim 12 wherein epitaxially forming the layer of silicon carbide on the first surface includes doping the silicon carbide with a first conductivity type so that the silicon carbide forms a collector region of the transistor.

15. The method of claim 14 wherein doping the silicon carbide includes doping the silicon carbide with an arsenic doping concentration of $5 \times 10^{15}$ to $5 \times 10^{17}$ atoms/cm$^3$.

16. The method of claim 14 wherein epitaxially forming the layer of silicon on the layer of silicon carbide includes doping the layer of silicon with a second conductivity type so that the layer of silicon forms a base region of the transistor.

17. The method of claim 16 wherein doping the layer of silicon includes doping the layer of silicon with a boron doping concentration of approximately $5 \times 10^{18}$ atoms/cm$^3$.

18. The method of claim 12 wherein providing the silicon substrate having the first surface includes providing a silicon substrate having a doped silicon layer on the substrate wherein the doped silicon layer is epitaxially formed on the substrate and wherein a surface of the doped silicon layer is the first surface.

19. A method of forming single crystal silicon on single crystal silicon carbide comprising:
    providing a single crystal silicon carbide surface;
    forming a plurality of micro-atomic multifaceted planes in the single crystal silicon carbide surface by creating a plurality of atomic level depressions in the single crystal silicon carbide surface; and epitaxially applying a layer of silicon on the single crystal silicon carbide surface.

20. The method of claim 19 wherein forming the plurality of micro-atomic multifaceted planes includes roughing the single crystal silicon carbide surface with abrasive particles.

21. The method of claim 19 wherein the step of forming the plurality of micro-atomic multifaceted planes includes creating the plurality of atomic level depressions having depths greater than approximately 5 nanometers.

22. A method of forming single crystal silicon carbide on single crystal silicon comprising: providing a single crystal silicon surface;

converting a portion of the single crystal silicon surface to a porous buffer layer; and epitaxially forming a layer of silicon carbide on the porous buffer layer.

23. The method of claim 22 wherein converting the portion of the single crystal silicon surface to the porous buffer layer includes contacting the single crystal silicon surface with hydrofluoric acid.

24. The method of claim 23 further including causing a current to flow between the single crystal silicon surface and the hydrofluoric acid.

25. The method of claim 24 wherein causing the current to flow between the single crystal silicon surface and the hydrofluoric acid includes causing a current having a current density of approximately 20 to 100 milliamps/cm$^2$ to flow for approximately one-half of a minute to ten minutes.

26. The method of claim 22 wherein epitaxially forming the layer of silicon carbide on the porous buffer layer includes depositing the layer of silicon carbide using one of chemical vapor deposition, plasma enhanced chemical vapor deposition, or gas phase molecular beam epitaxy.

27. The method of claim 22 wherein epitaxially forming the layer of silicon carbide on the porous buffer layer includes doping the layer of silicon carbide with germanium for reducing mechanical stress.

* * * * *